United States Patent
Kong

(10) Patent No.: US 10,615,157 B2
(45) Date of Patent: Apr. 7, 2020

(54) DECOUPLING CAPACITOR CIRCUIT

(71) Applicant: Magnachip Semiconductor, Ltd., Cheongju-si (KR)

(72) Inventor: Wan Chul Kong, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/997,351

(22) Filed: Jun. 4, 2018

(65) Prior Publication Data

US 2019/0081038 A1   Mar. 14, 2019

(30) Foreign Application Priority Data

Sep. 13, 2017  (KR) .................. 10-2017-0117098

(51) Int. Cl.
*H01L 27/02* (2006.01)
*H01L 29/94* (2006.01)
*H01L 27/092* (2006.01)
*H01L 27/08* (2006.01)

(52) U.S. Cl.
CPC ...... *H01L 27/0288* (2013.01); *H01L 27/0207* (2013.01); *H01L 27/0805* (2013.01); *H01L 27/092* (2013.01); *H01L 29/94* (2013.01)

(58) Field of Classification Search
CPC ............ H01L 27/0266; H01L 27/0288; H01L 27/092
See application file for complete search history.

(56) References Cited

U.S. PATENT DOCUMENTS

| | | | | |
|---|---|---|---|---|
| 5,637,525 | A | * | 6/1997 | Dennison ............ H01L 21/8238 257/274 |
| 5,650,746 | A | * | 7/1997 | Soltau .................. H03H 11/405 327/103 |
| 8,134,824 | B2 | | 3/2012 | Frederick et al. |
| 8,400,746 | B1 | * | 3/2013 | Keramat ............. H01L 27/0207 361/111 |
| 2008/0246539 | A1 | * | 10/2008 | Zadeh .................. H03H 11/483 327/558 |

* cited by examiner

*Primary Examiner* — Matthew L Reames
(74) *Attorney, Agent, or Firm* — NSIP Law

(57) ABSTRACT

A decoupling capacitor includes a first p-type metal-oxide-semiconductor (PMOS) transistor connected to a power rail in a standard cell library, a first n-type metal-oxide-semiconductor (NMOS) transistor connected to a ground rail in the standard cell library, a second PMOS transistor connected between the first NMOS transistor and the power rail, and a second NMOS transistor connected between the first PMOS transistor and the ground rail, wherein a gate of the second PMOS transistor is connected to a gate of the second NMOS transistor.

15 Claims, 5 Drawing Sheets

DECOUPLING CAPACITOR CIRCUIT

CROSS-REFERENCE TO RELATED APPLICATIONS

This application claims the benefit under 35 USC 119(a) of Korean Patent Application No. 10-2017-0117098 filed on Sep. 13, 2017 in the Korean Intellectual Property Office, the entire disclosure of which is incorporated herein by reference for all purposes.

BACKGROUND

1. Field

The following description relates to a decoupling capacitor. More particularly, the following description relates to a decoupling capacitor having improved immunity and reliability with respect to an electrostatic discharge (ESD).

2. Description of Related Art

A decoupling capacitor is commonly used for shunting noise generated at a supply node or a high impedance component of a circuit. Generally, in order to reduce noise between a supply node and a ground node, a capacitor having a large capacitance is mounted on a printed circuit board (PCB) using an application specific integrated circuit (ASIC) chip. However, when the capacitor is mounted outside the chip, the area occupied by the capacitor on the board increases. Therefore, in order to avoid the area increase phenomenon and improve the noise immunity of the chip itself, the decoupling capacitor is disposed in the chip.

That is, standard cells, which are used to implement logic functions in the ASIC chip design, do not occupy an area corresponding to the entire die of the chip. Furthermore, an empty space in which the standard cells are not disposed in a digital circuit block is filled with filler cells, which generally serve as a kind of filler called a fill cell. However, if the empty space is filled with the decoupling capacitor instead of the filler cells, the space utilization may be increased by a corresponding amount and the noise characteristic may be also improved. For this reason, in order that the decoupling capacitor may be disposed with a standard cell library when fabricating an application specific integrated circuit (ASIC) chip, the decoupling capacitor is provided in a library form along with the standard cell library.

In order to implement the decoupling capacitor as part of a circuit, a metal-oxide-semiconductor field-effect transistor (MOSFET) element that is an active element is generally used. However, in order to operate such an active device as a capacitor, a gate of the MOSFET is required to be connected to a power supply or a ground in a circuit structure. In this example, there is a possibility that the oxide film of the gate, having a relatively low breakdown voltage, is physically damaged by an electrostatic discharge (ESD) signal inputted from the outside of the chip. If the oxide film of the gate is to suffer from this damage, a leakage current consistently flows through the gate of the decoupling capacitor. Thus, the decoupling capacitor is no longer able to function as a capacitor.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a decoupling capacitor includes a first p-type metal-oxide-semiconductor (PMOS) transistor connected to a power rail in a standard cell library, a first n-type metal-oxide-semiconductor (NMOS) transistor connected to a ground rail in the standard cell library, a second PMOS transistor connected between the first NMOS transistor and the power rail, and a second NMOS transistor connected between the first PMOS transistor and the ground rail, wherein a gate of the second PMOS transistor is connected to a gate of the second NMOS transistor.

A source and a drain of the first PMOS transistor may be connected to the power rail, along with an N-well region of the first PMOS transistor.

A source and a drain of the first NMOS transistor may be connected to the ground rail, along with a bulk region of the first NMOS transistor.

A drain of the second PMOS transistor may be connected to a gate of the first NMOS transistor, and a source of the second PMOS transistor may be connected to the power rail.

A drain of the second NMOS transistor may be connected to a gate of the first PMOS transistor, and a source of the second NMOS transistor may be connected to the ground rail.

The first PMOS transistor, the first NMOS transistor, the second PMOS transistor, and the second NMOS transistor may have dimensions determined such that in response to a supply voltage being applied from the power rail, a voltage level at a gate of the second PMOS transistor has a level that is 40 to 60 percent of a voltage level of the supply voltage.

The first PMOS transistor and the second PMOS transistor may be formed in a P-type active region.

The drain region of the first PMOS transistor may be connected to the power rail by a metal wiring layer through a contact.

The first PMOS transistor and the second PMOS transistor may share a first shared source region.

The first shared source region may be connected to the power rail by a metal wiring layer through a contact.

The first NMOS transistor and the second NMOS transistor may be formed in an N-type active region.

The drain region of the first NMOS transistor may be connected to the ground rail by a metal wiring layer through a contact.

The first NMOS transistor and the second NMOS transistor may share a second shared source region.

The second shared source region may be connected to the ground rail by a metal wiring layer through a contact.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
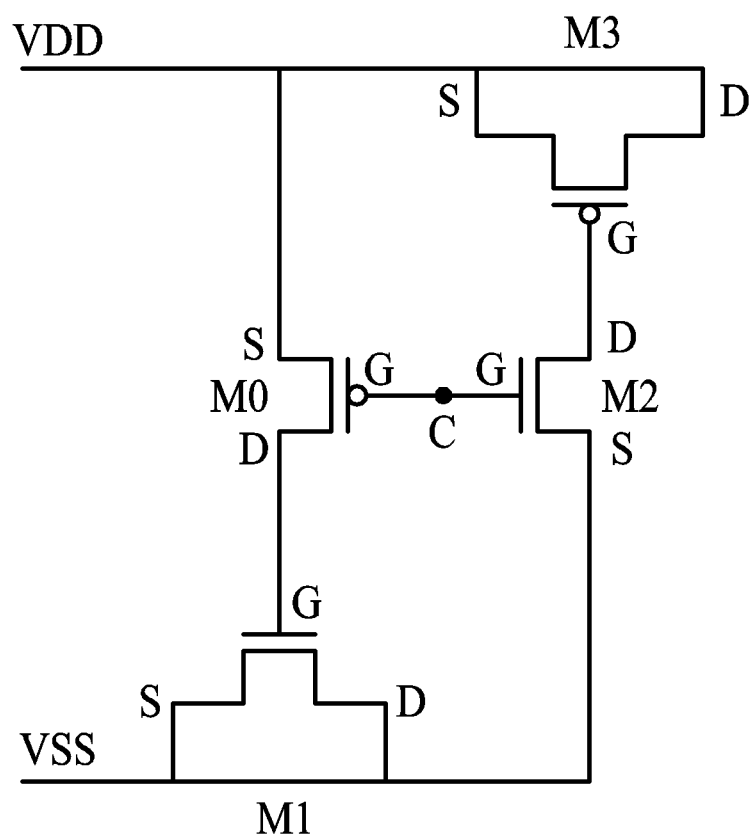
FIG. 1 is a view illustrating a decoupling capacitor circuit according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Examples are described in further detail below with reference to the appended drawings.

Examples disclosed herein pertain to a decoupling capacitor circuit structured to protect a gate of a MOSFET device from electrostatic discharge (ESD) signals. Examples of the disclosed decoupling capacitor circuit enable a chip adopting the same circuit to have improved reliability.

FIG. 1 is a view illustrating a decoupling capacitor circuit according to an example.

A decoupling capacitor circuit 100 according to an example may be appropriately disposed in an area in which standard cells are not disposed, in a standard cell library. As illustrated in the example of FIG. 1, the decoupling capacitor circuit 100 includes a first n-type metal-oxide-semiconductor (NMOS) transistor M1 and a first p-type metal-oxide-semiconductor (PMOS) transistor M3. In such an example, a source and a drain of the NMOS transistor M1 are connected to a ground rail to which a ground voltage VSS is supplied from the standard cell library, together with a bulk region that is a p-type substrate region. A source and a drain of the PMOS transistor M3 are connected to a power rail to which a supply voltage VDD is supplied from the standard cell library, together with an N-well region. In the example of FIG. 1, the decoupling capacitor circuit 100 further includes a PMOS transistor M0 connected to a gate of the NMOS transistor M1 and an NMOS transistor M2 connected to a gate of the PMOS transistor M3. The PMOS transistor M0 has a source connected to the power rail, a drain connected to the gate of the NMOS transistor M1, and a gate connected to the gate of the NMOS transistor M2. The NMOS transistor M2 has a source connected to the ground rail, a drain connected to the gate of the PMOS transistor M3 and a gate connected to the gate of the PMOS transistor M0. The gate of the PMOS transistor M0 and the gate of the NMOS transistor M2 are commonly connected to each other. This common connection is made in order to make a gate voltage to be equal to or higher than a threshold voltage by a current charge through a parasitic capacitance of the PMOS transistor M0 and the NMOS transistor M2 so that the gate is turned on, as the supply voltage VDD to the power rail rises.

Figure 2:
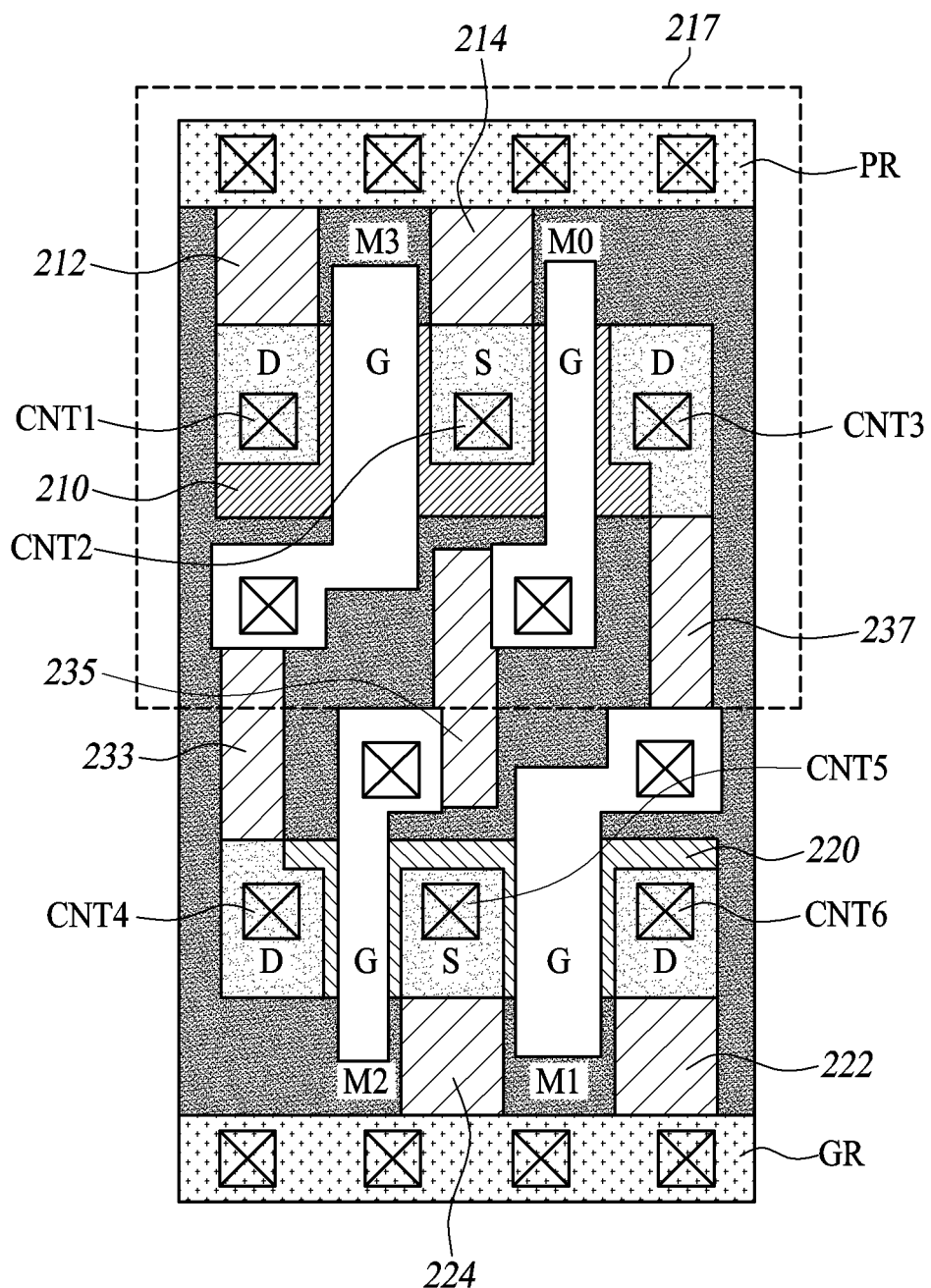
FIG. 2 is a view illustrating an example of a layout diagram of the decoupling capacitor circuit of the example of FIG. 1.

FIG. 2 is a view illustrating an example of a layout diagram of the decoupling capacitor circuit of the example of FIG. 1.

In the example of FIG. 2, FIG. 2 illustrates a P-type active area 210 and an N-type active area 220. The P-type active region 210 is a region in which the PMOS transistor M0 and the PMOS transistor M3 are formed. For example, the PMOS transistor M0 and the PMOS transistor M3 are formed in an N-well region 217. As illustrated in the example of FIG. 2, a drain region D of the PMOS transistor M3 is connected to a power rail PR by a metal wiring layer 212 through a contact CNT1. The PMOS transistor M3 and the PMOS transistor M0 share a source region S with each other. The source region S is connected to the power rail PR by a metal wiring layer 214 through a contact CNT2. The N-type active region 220 is an area in which the NMOS transistor M1 and the NMOS transistor M2 are formed. As illustrated in the example of FIG. 2, a drain region D of the NMOS transistor M1 is connected to a ground rail GR by a metal wiring layer 222 through a contact CNT6. The NMOS transistor M1 and the NMOS transistor M2 share a source region S with each other. The source region S is connected to the ground rail GR by a metal wiring layer 224 through a contact CNT5. On the other hand, a gate region G of the PMOS transistor M3 is connected to a drain region D of the NMOS transistor M2 by a metal wiring layer 233 through a contact CNT4. A drain region D of the PMOS transistor M0 is connected to a gate region G of the NMOS transistor M1 by a metal wiring layer 237 through a contact CNT3. A gate region G of the PMOS transistor M0 is connected to a gate region G of the NMOS transistor M2 by a metal wiring layer 235.

In a layout of such an example decoupling capacitor circuit, because both PMOS transistors and NMOS transistors are used, when the decoupling capacitor circuit is fabricated with the minimum design rule supported in the process, it is possible to obtain the maximum capacitance value in an active region where both the PMOS transistor and the NMOS transistor are to be placed. Furthermore, it is possible to change the size of the capacitor according to an area of a filler cell, so that the capacitance value of the decoupling capacitor circuit 100 may be designed to be finely tuned.

Referring again to the example of FIG. 1, when the supply voltage VDD rises, the voltage applied to the gate of the NMOS transistor M1 gradually increases due to the pull-up operation of the PMOS transistor M0. Accordingly, a depletion layer is formed while holes in the bulk region, which is the P-type substrate, move in a downward direction of the substrate under a gate oxide film, made of a material such as, but not limited to silicon dioxide ($SiO_2$), layer of the NMOS transistor M1. Subsequently, a channel layer begins to form while electrons increase in the depletion region as a voltage inputted to the gate of the NMOS transistor M1 approaches a threshold voltage Vth. When the voltage inputted to the gate of the NMOS transistor M1 has a value larger than the threshold voltage Vth, the channel layer becomes thicker, while a strong inversion layer is formed on the P-type substrate due to a large number of electrons gathered in the depletion region. Also, the maximum amount of the electrons that can be charged in a given physical geometry as a MOS capacitor is collected, until the supply voltage is stabilized. After the rising period of the source voltage VDD is completed, when the supply voltage VDD enters a steady state, the NMOS transistor M1 remains as being a charged capacitor. The PMOS transistor M0 serving as a pull-up is turned on accordingly, and a turn-on resistance is formed in a form that exists between the gate and the power rail as a gate input resistance of the NMOS transistor M1. Such a turn-on resistance of the PMOS transistor M0 is able to more safely protect the gate of the NMOS transistor M1 from a surge signal. Such a surge signal may be an electrostatic discharge (ESD) having a momentarily high voltage or current value from the outside rather than being limited to the normal supply voltage signal. After the rising period of the power source voltage VDD, when the power source voltage VDD enters a steady state, the NMOS transistor M1 remains as being a charged capacitor.

When the supply voltage VDD rises, the voltage applied to the gate of the PMOS transistor M3 gradually increases due to the pull-down operation of the NMOS transistor M2, and electrons in the N-well region existing under the gate oxide film layer of the PMOS transistor M3 move to a bottom region where the P-type substrate exists, thereby forming the depletion layer. Then, a channel layer begins to form, while holes increase in the depletion region as a voltage inputted into the gate of the PMOS transistor M3 approaches the threshold voltage Vth. When the voltage inputted into the gate of the PMOS transistor M3 has a value larger than the threshold voltage Vth, the channel layer becomes thicker. At this time, a strong inversion layer is formed on the N-type substrate due to a large number of holes gathered in the depletion region, and the maximum amount of the holes that can be charged in a given physical geometry as a MOS capacitor is collected. After the rising period of the source voltage VDD is complete, when the supply voltage VDD enters the steady state, the PMOS transistor M2 remains as being the charged capacitor. The NMOS transistor M2 is located between the gate of the PMOS transistor M3 and the ground rail, so that the turn-on resistance formed during the pull-down operation serves as an input resistance to the gate of the PMOS transistor M3, thereby protecting the gate from the ESD signal inputted from the ground rail.

When the PMOS transistor M3 and the NMOS transistor M1 are directly connected to the ground rail and the power rail as in alternative technologies, if the ESD signal is inputted, because the gate of the PMOS transistor M3 and the gate of the NMOS transistor M1 have a breakdown voltage relatively lower than a junction breakdown voltage, there is a high likelihood that the gate of the PMOS transistor M3 and the gate of the NMOS transistor M1 are damaged when the ESD is received. Then, when the gates are damaged by the ESD signal, the electrons or the holes charged in the channel region are discharged through the source/drain connected to the node of the ground rail along a crack of the gate oxide film damaged by the ESD signal, where the ESD signal is inputted to the node of the power rail or the ground rail, or through the source/drain along the gate connected to the power rail. Furthermore, a leakage path between the power rail and the ground rail is formed while the power is supplied, so that a significant amount of current is continuously dropped during device operation. Accordingly, it becomes impossible that the chip itself, including the decoupling capacitor, is normally operated. According to an example, it is possible to avoid the problem presented in the above-described alternative technologies by protecting the gate of the NMOS transistor M1 and the gate of the PMOS transistor M3 by the PMOS transistor M0 and the NMOS transistor M2, respectively.

Figure 3:
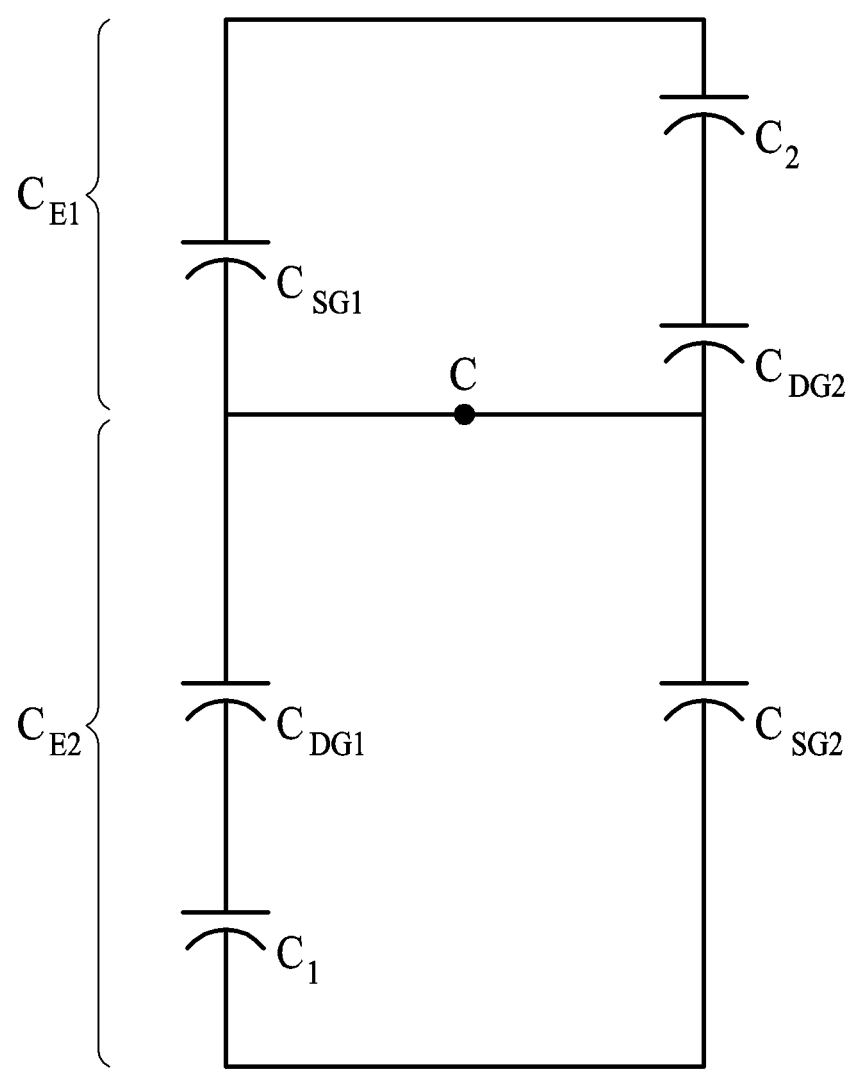
FIG. 3 is a view illustrating an equivalent circuit of the decoupling capacitor circuit of the example of FIG. 1 for obtaining the voltage at a node C of the decoupling capacitor circuit of the example of FIG. 1.

FIG. 3 is a view illustrating an equivalent circuit of the decoupling capacitor circuit of the example of FIG. 1 for obtaining the voltage at a node C of the decoupling capacitor circuit of the example of FIG. 1.

In the example of FIG. 3, $C_{SG1}$ represents a parasitic capacitance between the source and the gate of the PMOS transistor M0, and $C_{DG1}$ represents a parasitic capacitance between the drain and the gate of the PMOS transistor M0. $C_1$ represents an equivalent capacitance of the NMOS transistor M1. $C_2$ represents an equivalent capacitance of the PMOS transistor M3. $C_{DG2}$ represents a parasitic capacitance between the drain and the gate of the NMOS transistor M2, and $C_{SG2}$ represents a parasitic capacitance between the source and the gate of the NMOS transistor M2. $C_{E1}$ and $C_{E2}$ represent an equivalent capacitance of a circuit including $C_{SG1}$, $C_2$ and $C_{DG2}$, and an equivalent capacitance of a circuit including $C_{DG1}$, $C_1$ and $C_{SG2}$, respectively. In this example, a voltage $V_C$ at the node C may be expressed by the following Equation 1:

$$V_C = C_{E1}/(C_{E2}+C_{E1})*VDD \quad \text{(Equation 1)}$$

As may be seen from the above Equation 1, the voltage $V_C$ at the node C may be taken as a value obtained by distributing VDD according to a combination of $C_{E1}$ and $C_{E2}$, that is, a combination of $C_{SG1}$, $C_2$, and $C_{DG2}$, and $C_{DG1}$, $C_1$ and $C_{SG2}$. In order for the proposed decoupling capacitor to operate stably and have a large capacitance value, it is required that the voltage $V_C$ at the node C has a value of about VDD/2 in the steady state. In general, because an area allocation is performed such that the PMOS region occupies a larger area when a standard cell is fabricated, the voltage $V_C$ at the node C may have a value slightly higher than VDD/2. However, in other examples, by appropriately adjusting the sizes of the PMOS transistor M0, the NMOS transistor M1, the NMOS transistor M2 and the PMOS transistor M3, it is possible to adjust the value of the voltage $V_C$ at the node C to have a value between 40 percent and 60 percent of VDD. Thus, $V_C$ is not limited to a value of VDD/2, and may vary somewhat in various examples. Therefore, it is possible, as per the example of FIG. 3, to cause the decoupling capacitor circuit 100 to operate as a more stable MOS capacitor.

Figure 4A:
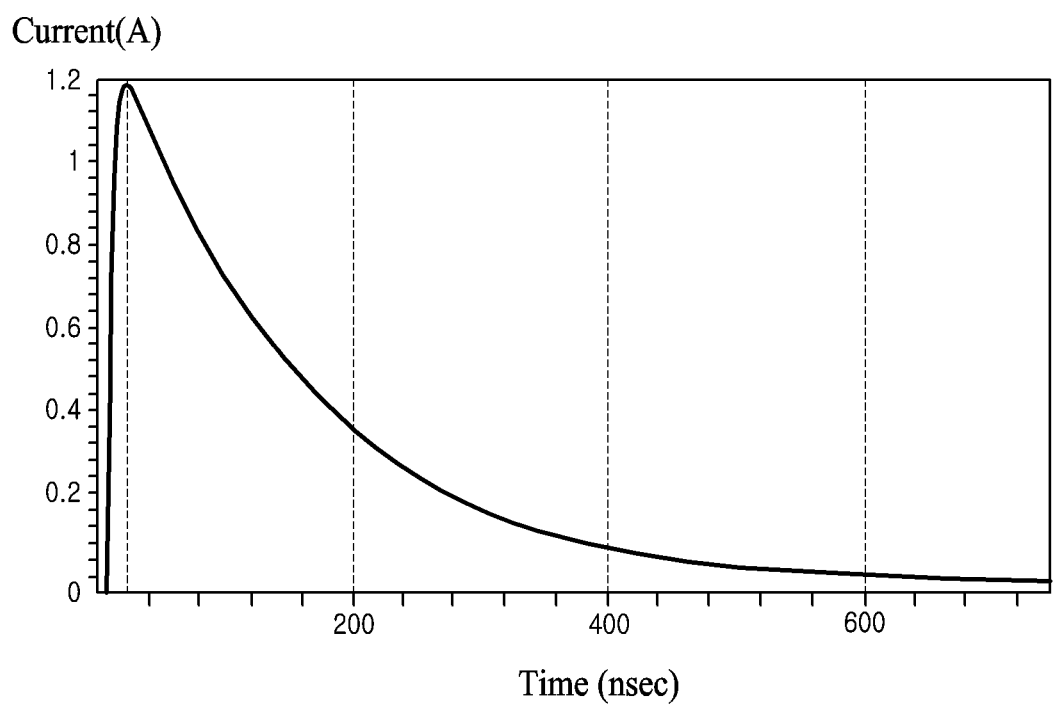
FIG. 4A is a view illustrating an example of a waveform of an ESD signal.
Figure 4B:
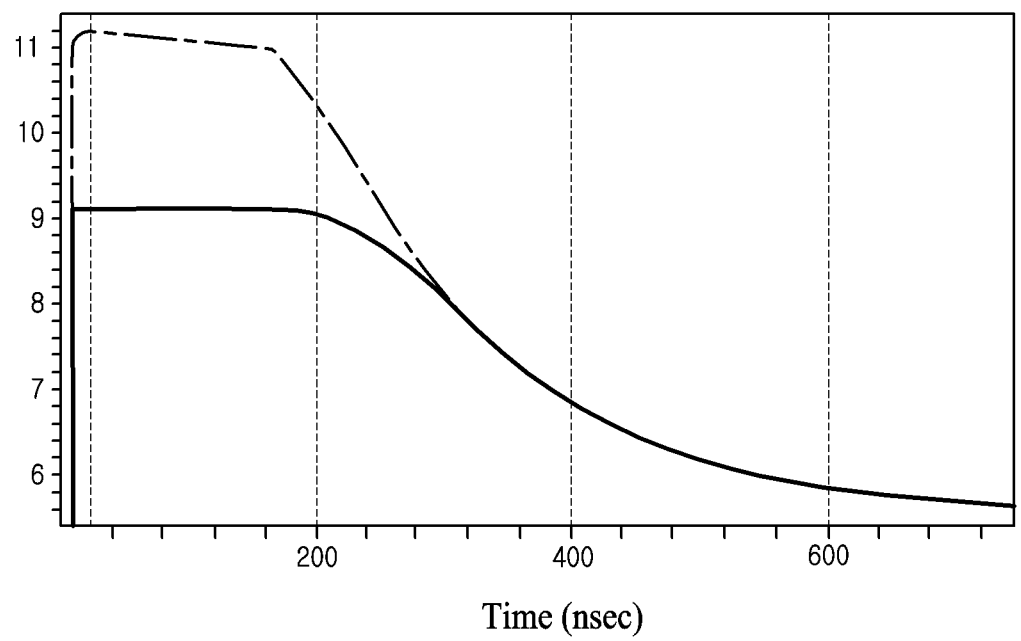
FIG. 4B is a view illustrating a result of performing an ESD simulation on a decoupling capacitor according to an example, and a conventional decoupling capacitor only including a PMOS transistor and an NMOS transistor.

FIG. 4A is a view illustrating an example of a waveform of an ESD signal, and FIG. 4B is a view illustrating a result of performing an ESD simulation on the decoupling capacitor according to an example, and a conventional decoupling capacitor only including the PMOS transistor and the NMOS transistor.

FIG. 4B shows a waveform of a voltage applied to the gate of the NMOS transistor M1 when the ESD signal shown in the example of FIG. 4A is inputted to the decoupling capacitor according to an example through the power rail, and a waveform of a voltage applied to the gate of the NMOS transistor when the ESD signal shown in FIG. 4A is inputted to the conventional decoupling capacitor through the power rail as a solid line and a dotted line, respectively. According to the simulation result, in the simulation of the decoupling capacitor according to an example, the voltage inputted to the gate of the NMOS transistor M1 is maintained at about 9V at a time point of 22.7 nsec, when the ESD signal has a maximum value of about 1.2 A. This voltage is maintained for a certain time, and then gradually decreases at a time point of 200 nsec. In the case of the decoupling capacitor according to alternative technologies, the voltage inputted to the gate of the NMOS transistor exceeds 11V at a time point of 22.7 nsec at which the ESD signal has a maximum value of about 1.2 A. Such a voltage is maintained for a certain time and then gradually decreases. Comparing the two waveforms shown in the example of FIG. 4B, it may be seen that the voltage inputted to the gate of the NMOS transistor M1 of the decoupling capacitor according to an example has a magnitude that is about 22 percent smaller than the voltage inputted to the gate of the NMOS transistor of the alternative decoupling capacitor.

Because the decoupling capacitor according to an example uses both PMOS and NMOS technologies, a region in which the PMOS and the NMOS are to be placed may be utilized as a capacitor as much as possible in the standard cell library. Therefore, a capacitance value having a value as large as possible in a given area may be obtained. Furthermore, the decoupling capacitor according to the examples may be provided as a cell library for each size. Therefore, the configuration according to examples provides an advantage that the library flexibility is increased, the capacitance value may be finely adjusted, the power noise is reduced and the immunity to the ESD signal is improved, thereby improving the reliability of the entire chip. In addition, the decoupling capacitors according to the examples may be fabricated using an RF SOI CMOS technology and may be fabricated using almost any CMOS process technologies, regardless of the process scale.

In the examples disclosed herein, the arrangement of the illustrated components may vary depending on an environment or requirements to be implemented. For example, some of the components may be omitted, or several components may be integrated and implemented together. In addition, the arrangement order of some of the components may be changed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A decoupling capacitor, comprising:
   a first p-type metal-oxide-semiconductor (PMOS) transistor connected to a power rail in a standard cell library;
   a first n-type metal-oxide-semiconductor (NMOS) transistor connected to a ground rail in the standard cell library;
   a second PMOS transistor connected between the first NMOS transistor and the power rail; and a second NMOS transistor connected between the first PMOS transistor and the ground rail,
wherein a gate of the second PMOS transistor is connected to a gate of the second NMOS transistor,
wherein a drain of the second NMOS transistor is connected to a gate of the first PMOS transistor, and a source of the second NMOS transistor is connected to the ground rail, and
wherein a drain of the second PMOS transistor is directly connected to a gate of the first NMOS transistor.

2. The decoupling capacitor of claim 1, wherein a source and a drain of the first PMOS transistor are connected to the power rail, along with an N-well region of the first PMOS transistor.

3. The decoupling capacitor of claim 1, wherein a source and a drain of the first NMOS transistor are connected to the ground rail, along with a bulk region of the first NMOS transistor.

4. The decoupling capacitor of claim 1, wherein a source of the second PMOS transistor is connected to the power rail.

5. The decoupling capacitor of claim 4, wherein the first PMOS transistor, the first NMOS transistor, the second PMOS transistor, and the second NMOS transistor have dimensions determined such that in response to a supply voltage being applied from the power rail, a voltage level at the gate of the second PMOS transistor has a level that is 40 to 60 percent of a voltage level of the supply voltage.

6. The decoupling capacitor of claim 1, wherein the first PMOS transistor and the second PMOS transistor are formed in a P-type active region.

7. The decoupling capacitor of claim 1, wherein the drain region of the first PMOS transistor is connected to the power rail by a metal wiring layer through a contact.

8. The decoupling capacitor of claim 1 wherein the first PMOS transistor and the second PMOS transistor share a first shared source region.

9. The decoupling capacitor of claim 8, wherein the first shared source region is connected to the power rail by a metal wiring layer through a contact.

10. The decoupling capacitor of claim 1, wherein the first NMOS transistor and the second NMOS transistor are formed in an N-type active region.

11. The decoupling capacitor of claim 1, wherein the drain region of the first NMOS transistor is connected to the ground rail by a metal wiring layer through a contact.

12. The decoupling capacitor of claim 1, wherein the first NMOS transistor and the second NMOS transistor share a second shared source region.

13. The decoupling capacitor of claim 12, wherein the second shared source region is connected to the ground rail by a metal wiring layer through a contact.

14. A decoupling capacitor, comprising:
a first p-type metal-oxide-semiconductor (PMOS) transistor connected to a power rail in a standard cell library;
a first n-type metal-oxide-semiconductor (NMOS) transistor connected to a ground rail in the standard cell library;
a second PMOS transistor connected between the first NMOS transistor and the power rail; and
a second NMOS transistor connected between the first PMOS transistor and the ground rail,
wherein a gate of the second PMOS transistor is connected to a gate of the second NMOS transistor, and
wherein the first NMOS transistor and the second NMOS transistor share a shared source region.

15. A decoupling capacitor, comprising:
a first p-type metal-oxide-semiconductor (PMOS) transistor connected to a power rail in a standard cell library;
a first n-type metal-oxide-semiconductor (NMOS) transistor connected to a ground rail in the standard cell library;
a second PMOS transistor connected between the first NMOS transistor and the power rail; and
a second NMOS transistor connected between the first PMOS transistor and the ground rail,
wherein a gate of the second PMOS transistor is connected to a gate of the second NMOS transistor,
wherein the first PMOS transistor and the second PMOS transistor share a shared source region.

* * * * *